United States Patent [19]

Logue

[11] Patent Number: 5,559,432
[45] Date of Patent: Sep. 24, 1996

[54] JOYSTICK GENERATING A POLAR COORDINATES SIGNAL UTILIZING A ROTATING MAGNETIC FIELD WITHIN A HOLLOW TOROID CORE

[76] Inventor: Delmar L. Logue, R.R. #1, Box 60, Herrick, Ill. 62431

[21] Appl. No.: 267,511

[22] Filed: Jun. 29, 1994

Related U.S. Application Data

[63] Continuation-in-part of Ser. No. 842,244, Feb. 27, 1992, Pat. No. 5,404,101, and a continuation-in-part of Ser. No. 108,880, Aug. 13, 1993, abandoned, and a continuation-in-part of Ser. No. 142,933, Oct. 29, 1993, and a continuation-in-part of Ser. No. 170,058, Dec. 20, 1993, and a continuation-in-part of Ser. No. 187,072, Jan. 27, 1994, and a continuation-in-part of Ser. No. 217,738, Mar. 25, 1994.

[51] Int. Cl.$^6$ .............................. G01B 7/30; G05D 1/08; G05G 9/00; G09G 5/00
[52] U.S. Cl. ................. 324/207.17; 74/471 XY; 324/207.22; 324/207.25; 901/46; 345/161; 244/234; 463/36
[58] Field of Search ................ 324/207.13, 207.16, 324/207.17, 207.18, 207.19, 207.20, 207.22, 207.25, 207.26; 74/471 XY; 200/6 A; 901/46; 340/870.31, 870.32, 870.33; 345/161, 164; 273/438; 244/221, 228, 234, 236, 237; 318/580, 584–586, 653

[56] References Cited

U.S. PATENT DOCUMENTS

| | | | |
|---|---|---|---|
| 4,584,577 | 4/1986 | Temple | 324/207.17 X |
| 4,595,843 | 6/1986 | Del Vecchio et al. | |
| 4,825,157 | 4/1989 | Mikan | 324/207.2 |
| 5,160,918 | 11/1992 | Saposnik et al. | 324/207.26 X |
| 5,168,221 | 12/1992 | Houston | 324/207.2 X |

*Primary Examiner*—Gerard R. Strecker

[57] ABSTRACT

A joystick transducer utilizing a rotating magnetic field within a hollow toroid core, this rotating field drives a polar sensor element to which a 360 degree variable flux coupling element is operated by a joysyick to generate an output signal the phase angle of which corresponds to the azimuth direction of joystick tilt and the amplitude of this same signal corresponds to the magnitude of joystick tilt. A plurality of independent joysticks are also provide on one hollow driving core.

10 Claims, 8 Drawing Sheets

JOYSTICK GENERATING A POLAR COORDINATES SIGNAL UTILIZING A ROTATING MAGNETIC FIELD WITHIN A HOLLOW TOROID CORE

CROSS-REFERENCE TO RELATED PATENT APPLICATIONS

This application is a continuation in part of parent patent application Ser. No. 07/842,244, entitled Rotary Sensing Device filed Feb. 27, 1992, now U.S. Pat. No. 5,404,101, and patent application Ser. No. 08/108,880 filed Aug. 13, 1993, now abandoned, 08/142,438 filed Oct. 29, 1993, 08/170,058 filed Dec. 20, 1993, 08/187,072 filed Jan. 27, 1994, 08/217,738 filed Mar. 25, 1994, all by the same applicant.

The original conception of this invention was filed in the U.S. Patent Office under Disclosure Document No. 319854 Nov. 9, 1992, and No. 330551 May 11, 1993.

BACKGROUND OF THE INVENTION

The present invention relates to the field of joystick controllers, and more in particular to a unique polar coordinates joystick position transducer utilizing a rotating magnetic field within a hollow toroid core.

DESCRIPTION OF THE PRIOR ART

It is known to employ joystick transducers in which the output signals are dependent on the tilt displacement of a joystick relative to two axes, such joystick transducers typically employ gimbal or ball and socket arrangements for pivotal motion, which motion changes the flux path between the inductors to generate uniaxial inductance levels relative to the x-y coordinates.

Most prior art inductive joystick transducers utilize four inductors arranged on x-y axes to transduce the tilt of an operator rod into four amplitude modulated signals. In spite of many attempts, such as concave pole shapes, and various pick-up coil geometry designs, prior art joysticks still have a non-circular response pattern due to the separated pole structure found in all prior art joystick transducers. A true polar coordinates joystick transduction contained in one signal has not been found in prior art by the applicant.

The basic joystick motion is in essence a polar coordinate function, consisting of a tilt direction and a magnitude of tilt. It would seem the most simplified transduction of this motion would be a polar coordinate output signal, in which the tilt direction is indicated by the signal's phase angle and the magnitude of tilt indicated by the amplitude of that same signal.

Even though most final controlled elements such as electric motors or hydraulic cylinders are driving a Cartesian coordinate system, a polar coordinate signal would offer a large measure of simplicity owing to only one signal to transmit from the joystick transducer to the computer interface. There is also intrinsic simplicity in processing a polar coordinate signal, such as phase shifting for axis rotation, and a simple amplification factor corresponding to the length of the variable polar line segment drawn from the fixed reference point. Many construction machines such as cranes, back-hoes, and some robotic arms utilize polar linkage geometries, thus it is contemplated a joystick generating a polar coordinates signal would provide an analogical transducer of such operations. In the field of computer video graphics many displays employ polar graphs, thus a true polar signal is needed to fulfill a correlated transduction.

SUMMARY

An object of the present invention is to provide a true polar coordinates joystick transducer, in which the operating rod tilt direction is indicated by the output signal's phase angle, and the magnitude of tilt of the operating rod is indicated by the amplitude of that same signal.

Another object of the present invention is to provide a polar coordinates joystick transducer having a transduction response that is omnidirectional, not favoring any rotational direction since the azimuth transduction element is an unsegmented circle having intrinsic infinite azimuth resolution.

Another object of the instant invention is to provide a thumb actuated polar coordinates joystick controller small enough, and rugged enough to fit into a conventional aircraft control stick, having a self-centering feature to return the controller to a netural position when not in use even in the presence of external vibration.

It is an object of the invention to provide a polar coordinates joystick controller having an inherent signal null at the centered position, needing no zeroing circuits, this signal null having no deadband. This center position null is fixed by the simple geometry of the flux coupling member having no mechanical linkages, or sliding parts.

It is also an object of the invention to provide a joystick controller having an inherent immunity to electromagnetic interference.

Owing to the mentioned advantages it is contemplated the polar coordinates joystick transducer embodiments of this invention may find use in the piloting of an aircraft or spacecraft.

The ferromagnetic cores utilized in this invention can be manufactured using well developed pot core technology. The sine-cosine excitation currents are very low owing to the two completely closed magnetic circuits of the rotating field driving core.

BRIEF DESCRIPTION OF THE DRAWINGS

The present invention will be understood more fully from the detailed description given below and from the accompanying drawings of the preferred embodiments of the invention, which, however, should not be taken to limit the invention to the specific embodiments but are for explanation and understanding only.

In the drawings:

FIGS. 21, 21A, 22, 22A and 23 illustrate the second embodiment of a polar coordinates joystick transducer utilizing a segmented sphere as a flux directing element.

Rotating Magnetic Field Sensor Fundamentals

Figures 1, 2:
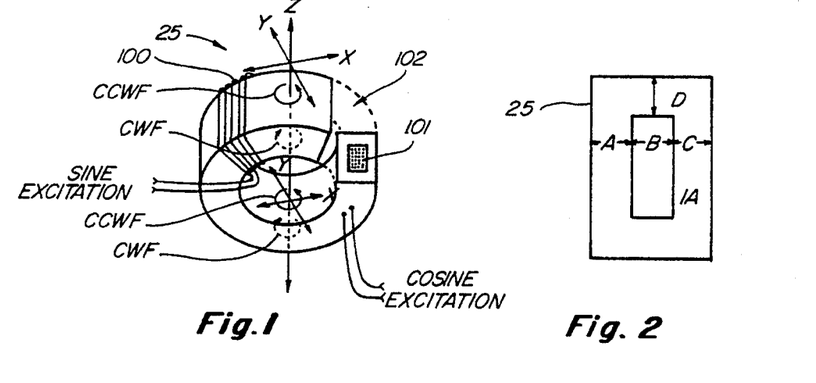
FIGS. 1–7, 7A, 8 and 9 illustrate the fundamentals of polar coordinates sensing utilizing a rotating magnetic field within a hollow toroid core.

In view of the fact that rotating magnetic fields as applied to inductive sensing, are limited in prior art, the inventor believes it proper to describe the fundamentals of 360 degree polar coordinate sensing. Referring now to FIG. 1, a hollow toroid core 25 of ferromagnetic material, is shown in a cross-sectional view, the inside excitation winding 101, having connecting leads labeled COSINE EXCITATION, and also having an outside excitation winding 100 wound around the outside of hollow toroid 25, having connecting leads labeled SINE EXCITATION. When sine-cosine excitation (two pure sinewaves displaced by 90 degrees) is applied to the inside and outside windings (sine excitation being applied to one winding, and cosine excitation being applied to the other winding) a rotating magnetic field is created coextensive throughout the entire core, originating at the domain level. The axis of each rotating magnetic domain being perpendicular to the surface of core 25 everywhere. This hollow toroidal inductor is the one geometric shape, in which the entirety of the core material inherently has:

(1) orthogonality between two coextensive magnetic circuits.

(2) two completely closed coextensive magnetic circuits.

(3) a sine-cosine generated 360 degree rotating magnetic field.

(4) a constant flux density (non-collapsing).

(5) surface-perpendicular distributive axes (plural) at all points in the hollow toroid core wall.

(6) orthogonal-equality between two sinewave fluxes displaced by 90 degrees.

(7) inherent synchronism between adjacent mounted polar sensors co-interference as in conventional proximity sensors).

Figure 9:
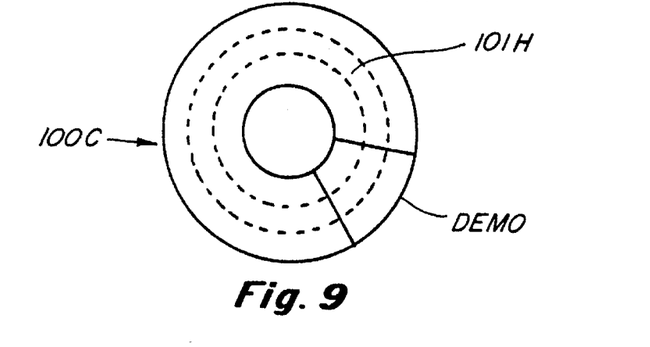

FIG. 9 is a toroid core 100C having a hollow portion 101H illustrating the three dimensional structure of the rotating magnetic field used to drive the polar coordinates sensor.

Figure 8:
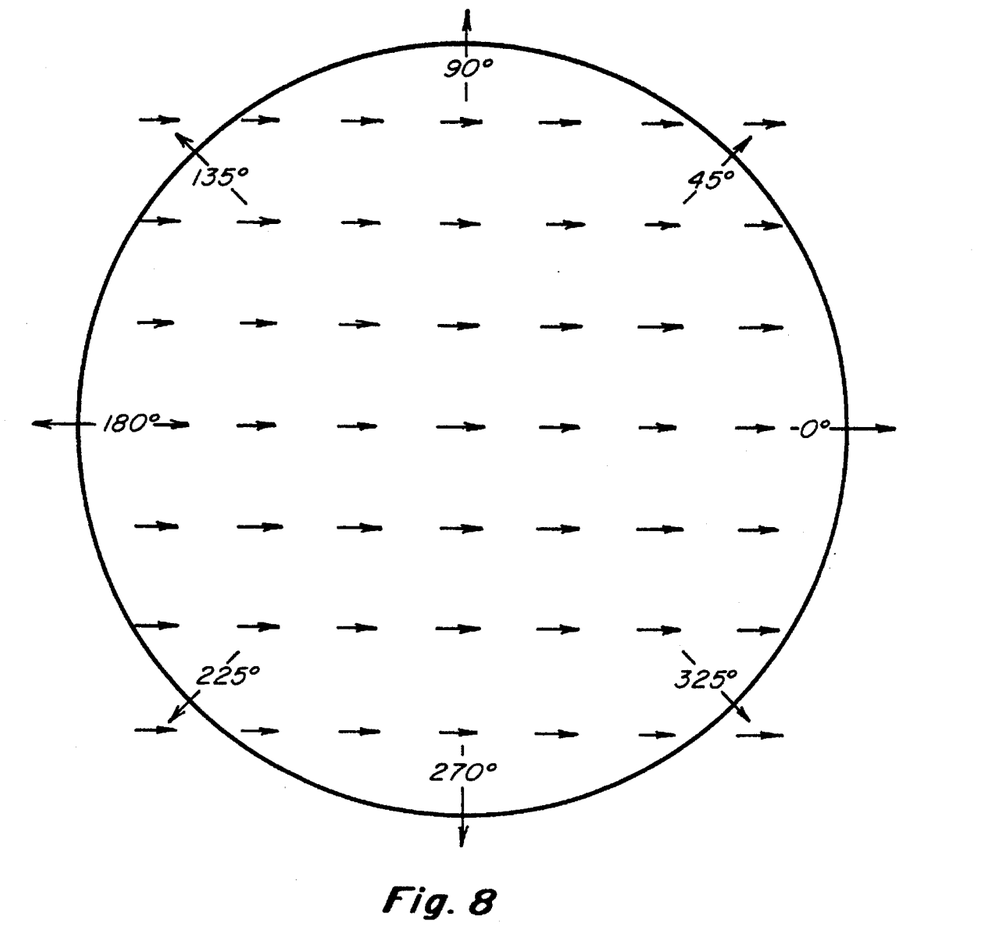

FIG. 8 is a diagram illustrating the distributive axes nature of rotating magnetic field within hollow toroid core 25. The arrows represent the individual magnetic moments rotating through 360 degrees.

This diagram may also represent a small portion of the total field, such a the portion DEMO in FIG. 9.

The inherent properties of this rotating magnetic field sensor concept are:

(1) lower excitation currents, because both inside and outside excitation winding fields are completly closed magnetic circuits.

(2) the transducing response is hysteresis free.

(3) the output signal amplitude is not rate dependent, (a moving stationary target produces the same output level).

(4) noise immunity of a toroid core.

(5) noise immunity of a magnetically saturated toroid core.

(6) a very simple core and winding structure.

(7) multiple pick-up capability.

Refer now to FIG. 1 to determine the field rotational relationships at four points on a diametrical Z-axis line perpendicular intersecting the hollow toroid wall at four points. The solid and dashed circular arrows CCWF, and CWF indicate counter-clockwise and clockwise rotational directions.

FIG. 2 is a cross-section of the hollow toroid showing the relative wall thickness of the hollow toroid core, dimensions A, C, and D should be equal to provide a uniform flux path for the inside excitation winding.

Figure 3:
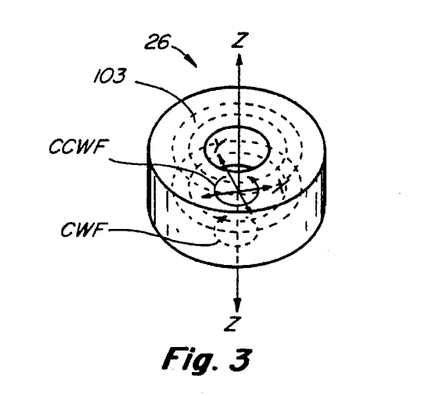

FIG. 3 is a perspective view of hollow toroid 26, the Z-axis intersects the side walls of core 26, the solid and dashed arrows indicate the relative field rotational directions, (the inside and outside excitation windings are not shown for clarity).

With sine-cosine orthogonal to one another the magnetization vector is forced into rotation. If each plane of the core is inductively balanced, the rotation will be circular and not elliptical. Under the influence of sine-cosine induction there is a coextensive rotating magnetic field induced throughout the hollow toroid core, unlike any rotating magnetic field generated by conventional stator poles or cross coil arrangements, a rotating magnetic field having inherent uniformity.

In order to utilize this rotating magnetic field for eddy current polar coordinates sensing one more basic component is added to the hollow toroid, called a polar sensor (PS).

Figure 4:
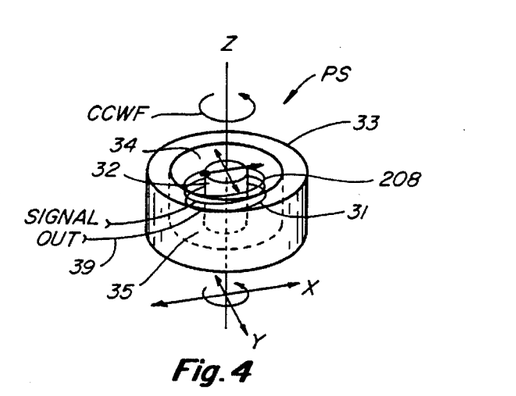

FIG. 4 is a perspective view of a polar sensor 207PS illustrating the structural detail. The central pole 32 is concentrically surrounded by the concentric cuter pole 33, providing an annular coil space 34. Poles 32, and 33 are connected by means of a base portion 35, wherein this complete pick-up core is formed of ferromagnetic material, and is the same as half a conventional pot core, (a hole in the central pole is not needed) the signal coil 208 is wound around the central pole 32, normally the connecting leads would enter through a small hole in base portion.

Figure 5:
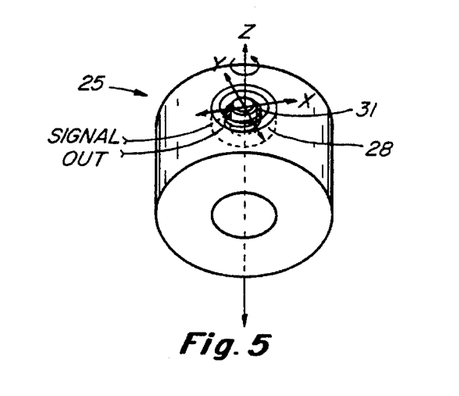

FIG. 5 is a perspective view of the mounted polar sensor 207PS, showing how the pick-up core 207 is mounted in a bore in the outer circumference wall of the hollow toroid 25 (the hollow inside excitation winding space is not shown). With the Z-axis of the the pick-up core 207 perpendicular to the surface of hollow toroid 25, the rotating field is coupled 360 degrees around the pick-up core 207. Notice that the pick-up coil 208 is coplaner to the flux lines of the rotating magnetic field, thus with no target present no flux linking occurs, and no signal is generated. With no target present the fringing flux above the sensing face has a hemispherical flux pattern, with the zenith (Z-axis) being coaxial to the pick-up core 207 axis. In this application the polar circle (sensing face) of the pick-up core is referenced in terms of azimuth degrees.

Figure 6:
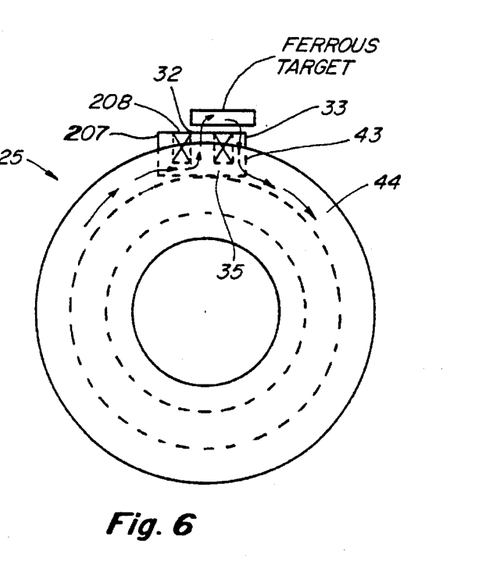

Refer now to FIG. 6, which is a side view of hollow toroid core 25, and an axial cross-section view of the mounted pick-up core 207 and pick-up coil 208. A ferrous target is couples the fringing flux from the central pole 32, through the FERROUS TARGET and down through the concentric outer pole 33 and back to hollow toroid 25. Thus a portion of the rotating flux in hollow toroid 25 is being routed through the FERROUS TARGET, and linking coil 208. Notice the phase of this signal in reference to one of the excitation windings of FIG. 1, depends on the azimuth location of the ferrous target over the concentric outer pole 33. Ferrous targets couple flux between the central pole and the concentric outer pole, whereas non-ferrous targets repel flux between these poles. The point to be made, ferrous targets unbalance the hemispherical flux pattern in one direction and non-ferrous targets unbalance the pattern in the opposite direction, thus the relative output signals differ by 180 degrees. Again an important point is only a small portion of the total flux lines within the hollow toroid are actually coupled to the pick-up core 207, this contrasting with conventional inductive devices where usually a major portion of the generated field is coupled to the transduced element. The pick-up elements mounted in bores in the wall of the hollow toroid utilized in this invention are designed to leave the rotating flux within the hollow toroid undistorted. Again a hollow toroid core is the one geometric shape in which two pure sinewave fluxes displaced by 90 degrees add to a constant length rotating flux vector utilizing the entirety of the core.

Due to this fact two pure sinewave voltages displaced by exactly 90 degrees is the preferred excitation for all embodiments of the invention disclosed herein.

Figure 7:
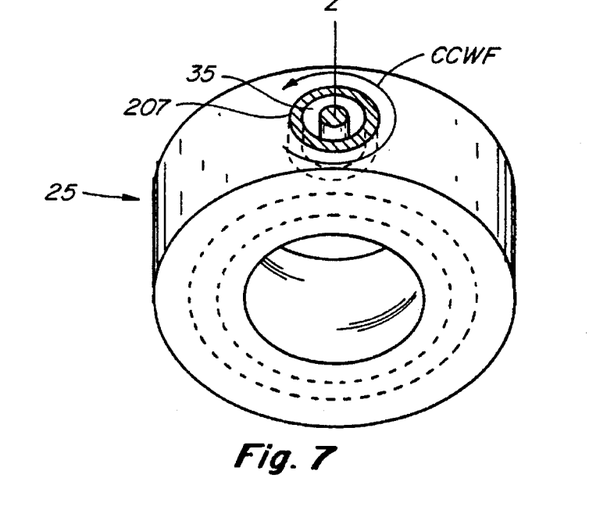

FIG. 7 is a perspective view of the hollow toroid 25, showing the mounted pick-up core 207 having an annular pick-up coil space 35 (coil not shown). The circular arrow CCWF (counter-clockwise field) indicates the rotating field flux vector (the collective sum of the instantaneous domain polarity), the axis (zenith) of rotation being Z. The inside and outside excitation windings are not shown for clarity.

Note: the reference numbers assigned to parts described in this fundamentals section may not correspond to the reference numbers assigned in the remainder of this application.

DETAILED DESCRIPTION OF PREFERRED EMBODIMENTS

Figures 10, 11, 11A, 13:
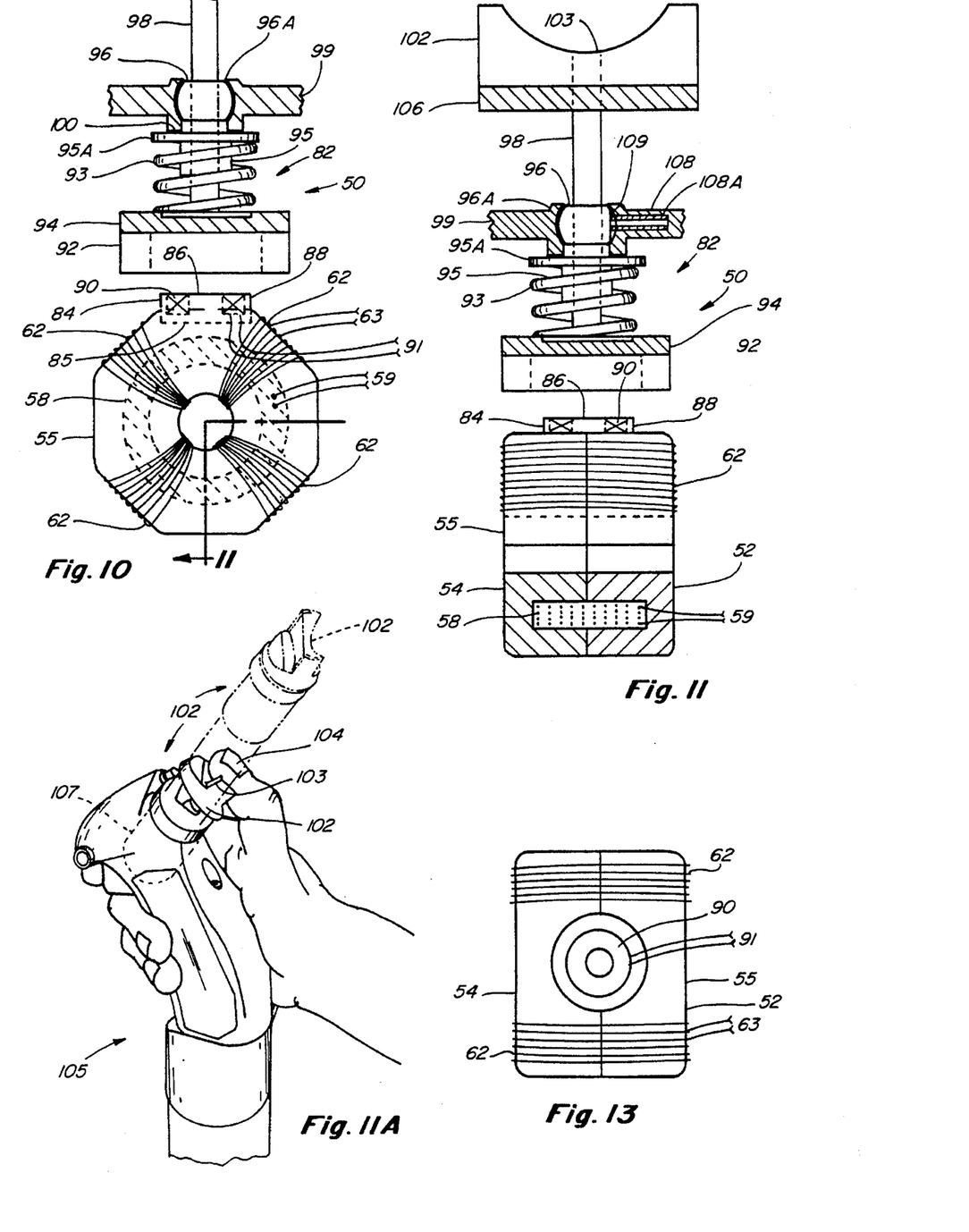
FIGS. 10, 11, 11A and 12–14 are the first embodiment of a polar coordinates joystick transducer utilizing a ferromagnetic toroid core as a flux concentrating ring to direct the azimuth flux coupling relative to the joystick operating rod tilt direction and magnitude.
Figure 12:
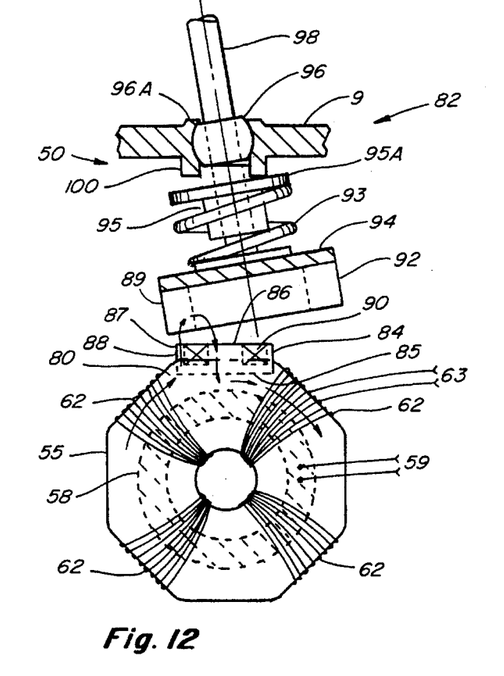

FIGS. 10–12 show joystick transducer 50, which utilizes a skewable toroid core as the flux directing element, this embodiment also having a detent (breakout) provision.

FIG. 10 is a central axis view of the hollow toroid driving core 55, comprising halves 52, and 54, as also seen in FIG. 11. Driving core 55 also has a first excitation winding 58 wound within the hollow portion, with connecting leads 59. A second excitation winding 62 is wound around the outside as four subcoils, with connecting leads 63.

A pick-up assembly 82 comprising pick-up core 88, containing pick-up coil 90, is the same as utilized in my previous rotating magnetic field patent applications, and is mounted in a bore in the outer circumference wall of hollow toroid 55, this bore being centered on a flat portion of the octagonal shaped outer circumference. This octagonal shape, as explaned in my previous applications, is a rectilinear means to make the flux lines cross the pick-up core 88 coplaner to pick-up coil 90. This octagonal shaped outer circumference is designed to eliminate the last vestige of ellipticity from the 360 degree rotating flux pattern above the pick-up core 88 sensing face. Pick-up core 88 may be a conventional pot core half having no wire lead gaps in the outer cylindrical sidewall. Pick-up coil 90 should have the connecting leads routed out through a small hole in the base portion 85, and from there out through a small hole in the hollow toroid, in this way the outer cylindrical magnetic pole 84 remains unbroken. Pick-up assembly 82 further comprises, skewable flux concentrating ring 92 formed of ferromagnetic material, and is utilized in this embodiment to direct i.e. couple the rotating flux to the pick-up coil 90 in an omnidirectional transduction. Flux concentrating ring 92 is formed of a high permeability ferromagnetic material such as ferrite or powdered iron.

Figure 14:
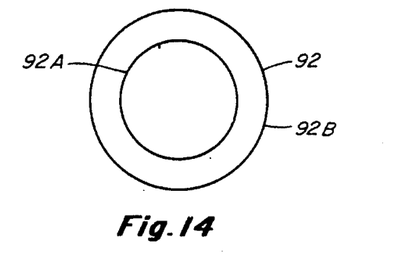

A conventional ferromagnetic toroid core may also be used (a radial view of this core is shown in FIG. 14) the lesser diameter being 92A, and the greater diameter being 92B. Flux concentrating ring 92 is attached to a non-metallic washer 94 by means of a strong glue. Washer 94 is made of a rigid plastic material such as nylon, and this mounting washer in turn is concentrically attached to the operating rod 98 by means of threads, and thus the flux concentrating ring 92 is concentric relative to operating rod 98. As an alternative, flux concentrating ring 92 may be formed of a non-ferrous material such as copper or aluminum, and in that case the flux will be concentrated 180 degrees opposite azimuth as compared to a ferrous material, and the output signal phase will likewise differ by 180 degrees.

Operating rod 98 is universally pivoted by means of a ball and socket arrangement. Ball joint 96 is mounted in socket 96A, which in turn is part of housing 99. The zero centering means comprises spring 93 under tension pushing against mounting washer 94 and a sliding detent or breakout member 95 which will be described in detail later. As can be seen in FIGS. 10, and 11, when the operating rod 98 is in the zero center position flux concentrating ring 92 is concentric above the circular pick-up core 88, and thus has a symmetrical 360 degree balanced flux coupling effect to the 360 degree rotating flux pattern that fringes above pick-up core 88. In this centered position there is no net coupling to pick-up coil 90 since the flux lines are passing coplaner to pick-up coil 90, and thus no output signal is generated. Due to the inherent high sensivity to any directional flux imbalance, this zero center position is inherently a very sharp point having a linear increasing amplitude as the operating rod is tilted away from the exact center position.

By selecting optimum dimensions of the flux concentrating ring 92 a linear tilt signal amplitude response may be provided.

Figure 15:
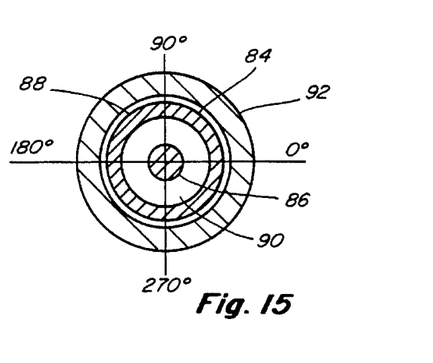
FIGS. 15–20 illustrate the omnidirectional transduction of the flux concentrating ring upon the pick-up core.
Figure 16:
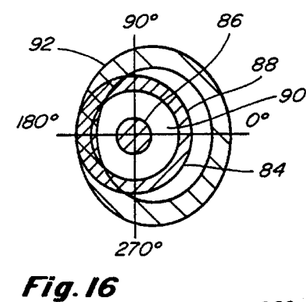
Figure 17:
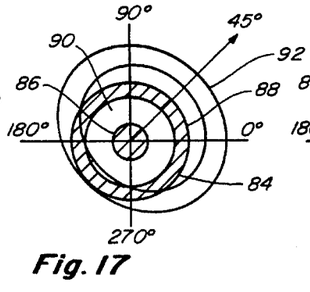
Figure 18:
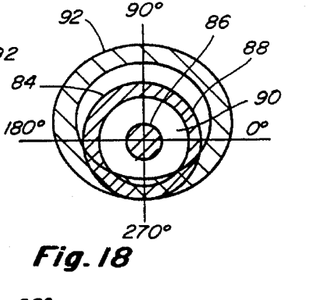
Figure 19:
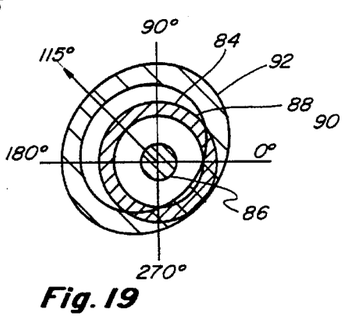
Figure 20:
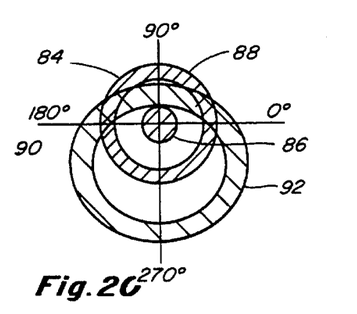

FIG. 12 shows the operating rod 98 tilted to the left, thus moving the flux concentrating ring to the right. In this skewed position a portion 89 is closer to a portion 87 of the outer cylindrical pole 84 of pick-up core 88, unbalancing the rotating flux pattern. The flux lines are no longer coplaner to the pickup coil and linking occurs. As seen in FIG. 12 the flux lines 80 within hollow toroid 55 flow up through portion 87, through a portion of flux concentrating ring 92, and down through central magnetic pole 86, and back to hollow toroid 55. Thus pick-up coil 90 is linked by a flux having a flux phase angle corresponding to the tilt direction, generating an output signal having a phase angle corresponding to this tilt direction. FIGS. 15–20 show six flux coupling positions of flux concentrating ring 92, illustrating the action of this skewable toroid core member, these figures being a top view of pick-up core 88 showing the central magnetic pole 86 and pick-up coil 90. Pick-up core 88 in FIGS. 15–20 has azimuth reference points arbitrarily chosen for convenience of description. FIG. 15 shows flux concentrating ring 92 concentrically centered above pick-up core 88, in this position the flux is 360 degree balanced and no signal is generated. In FIG. 16 flux concentrating ring 92 is shown eccentric toward the 0 degree azimuth of pick-up core 88, wherein the unbalanced flux pattern is concentrated in the 180 degree azimuth, and a flux bridging effect is provided in the 180 azimuth of pick-up core 88. Refer to FIG. 12 for a side view of this coupling action, provided by the skewing of flux concentrating ring 92, producing a 180 degree signal. FIG. 17 shows the flux concentrating ring 92 eccentric toward the 45 degree azimuth, thus providing coupling in the 225 degree azimuth, and a corresponding 225 degree signal is generated in pick-up coil 90. FIG. 18 shows flux concentrating ring 92 eccentric toward the 90 degree azimuth, resulting from operating rod 98 being tilted in the opposite direction, and a flux coupling is provided in the 270 degree azimuth of pick-up core 88, generating a 270 degree signal. It should be noted that the circular shape (unsegmented toroid core) of flux concentrating ring 92 directing the flux angle around the unsegmented outer cylindrical magnetic pole 84 of the pick-up core 88 provides an omnidirectional transduction favoring no rotational direction. FIGS. 19, and 20 illustrate the tilt magnitude transduction principle of this invention wherein FIG. 19 shows flux concentrating ring 92 slightly offset toward the 115 degree azimuth of pick-up core 88, here the flux bridging effect of flux concentrating ring 92 being less than in FIGS. 16–18, and a corresponding lower amplitude 295 degree signal being generated in pick-up coil 90. FIG. 20 shows the flux concentrating ring 92 more offset toward the 270 degree azimuth of pick-up core 88 coupling a large 90 degree flux, thus a high amplitude 90 degree signal being generated in pick-up coil 90. The point to be made here is the greater the operating rod tilt angle, the greater the flux coupling provided by the greater skewed angle of flux concentrating ring 92, and the output signal has a corresponding greater amplitude. As can be seen the output signal is a phase-amplitude modulated representation of the operating rod tilt direction and magnitude of tilt.

Turn now to the prospective use of polar coordinates joystick transducer 50 as a thumb actuated aircraft controller. Refer now to FIGS. 11, 11A, showing a thumb actuated button 102 mounted on operating rod 98. Notice button 102 has a saddle shaped top 103 curved to fit thumb 104. FIG. 11A is a perspective view of a standard military aircraft control column grip 105.

FIG. 11 is enlarged to show detail, and it is believed the invention can be miniaturized to fit into recptacle 107 in FIG. 11A. To counter-balance the weight of the flux concentrating ring 92 a counter-weight 106 may be added to button 102. To prevent unwanted rotation of button 102 ball joint 96 may have a groove 109 to receive an anti-rotation pin 108, this pin fits in a bore in the housing 99 (shown in fragmentary), this pin should in no way hinder the tilt motion of the operating rod 98. FIG. 11 shows the anti-rotation pin 108 mounted in a small bore 108A drilled in housing member 99. Housing member 99 is only partially shown in these drawing figures, housing 99 may take the shape of housing 199 shown in FIGS. 21–23, providing connection between hollow toroid 55 and ball joint 96, 96A. The hollow toroid core 55 may be rigidly mounted in housing 99 by means of an insulating potting compound such as epoxy. The self-centering feature of polar coordinates joystick controller 50 comprises spring 93 acting against attachment washer 94 and a tubular sliding detent (break-out) member 95. Sliding detent member 95 has a collar 95A formed at the upper end which spring 93 acts upon. In the center position as shown in FIGS. 10, and 11, the collar 95A of sliding detent 95 touches flat 360 degrees around the raised socket flange 100, providing a stable centered position detent. When the operating rod 98 is tilted as in FIG. 12 the sliding detent 95 compresses compression spring 93 and collar 95A breaks over circular raised socket flange 100 producing a break-out action. By chosing optimal dimensions of members 95A, and 100 a satisfactory break-out response may be obtained.

Figure 21:
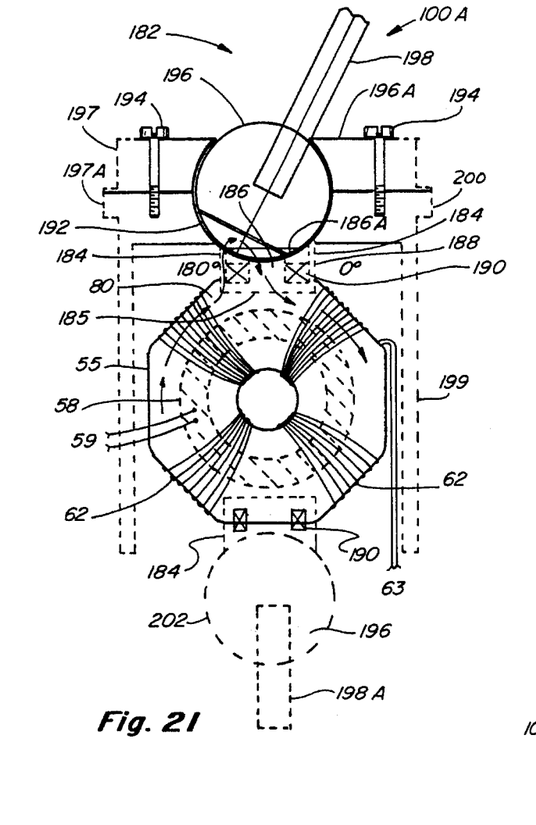
Figure 22:
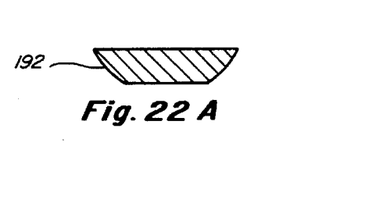
Figure 23:
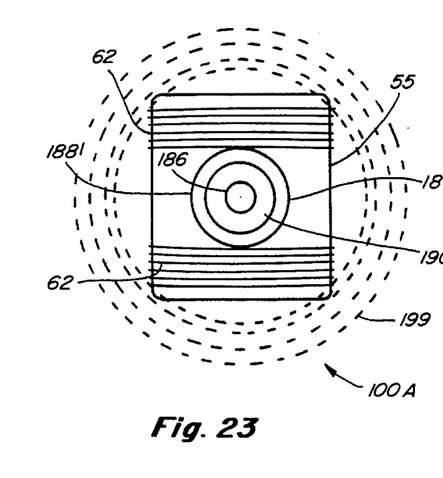

FIGS. 21–23 illustrate joystick transducer 100A embodiment of the invention. The pick-up assembly 182 of joystick transducer 100A utilizes a ferromagnetic segmented sphere 192 as a flux directing element. Said segmented sphere 192 rotates above a pick-up core 188, comprising a central cylindrical pole 186, and an outer cylindrical pole 184 and an outer cylindrical 184 connected by a base portion 185, with a pick-up coil 190. Pick-up core 188 has a concave sensing face 186A. This concave (spherical) sensing face 186A is shown in greater detail in FIG. 21A. This concave sensing face conforms to the spherical geometry of ball joint member 196, and segmented sphere 192 and provides a tighter flux coupling for a higher amplitude output signal and also improves amplitude linearity. The segmented sphere 192 (lower portion of a sphere as shown in FIG. 22A) is skewably supported in a non-metallic ball joint 196 formed of nylon or other rigid plastic. It should be noted the ball joint 196 is positioned partially within the concave sensing face 186A such that the segmented sphere flux coupling element 192 moves in a skewed motion partially within the concave sensing face 186A of pick-up core 188. Ball socket 196A may be formed of rigid plastic or a nonferrous metal such as aluminum. Socket 196A is divided into two sections, an upper half 197 and a lower half 197A, that are fastened together by means of screws 194. As shown the housing 199 may be cylindrical, having a conventional 360 degree azimuth reference adjustable mounting flange 200. This same cylindrical housing may also be used to house polar coordinates joystick transducer 50 of FIGS. 10–12. The hollow toroid core 55 is rigidly supported in housing 199 by means of a rigid encapsulating compound 201 (dashed diagonal lines) such as epoxy providing a moisture tight seal. The ball joint 196 is rotated by means of a tiltable operating rod 198, formed of metal. FIGS. 21, 22 show the operating rod 198 being coaxial to the axis of symmetry of segmemted sphere 192. A conical centering spring 195 is shown in FIG. 22. A suitable hand fitting member (not shown) may be attached to the upper end of the operating rod, or in a robotic application, operating rod 198 may be inserted in a robotic spherical joint member for transducing the joint angle. FIG. 21 is a central axis view of hollow toroid core 55 having a first sine-cosine excitation winding 58 wound within hollow toroid 55, having connecting leads 59. A second sine-cosine excitation winding 62 is wound around the outside of hollow toroid 55 at four equally spaced positions, being wound in symmetry to the mounted pick-up core 188 for flux symmetry, and having connecting leads 63. FIG. 22 is a cross-section view of hollow toroid core 55, showing the inside sine-cosine excitation winding 58, this rotating magnetic field source being the same as polar coordinates joystick 50. In both joystick 50 and joystick 100A the hollow toroid driving core 55 may be rididly mounted in the housing members 99, 199, by means of a rigid encapuslating compound such as epoxy, this compound surrounds most of core 55, and also keeps out moisture. These polar coordinate joystick transducers may be utilized in any application where a universal joint transduction is required, such as in robotic arm joints. The simple design, and compact size may allow mounting within a robotic arm. The unique multiple pick-up driving feature provided by the distributive axes rotating magnetic field inherent in the hollow toroid core 55 may be utilized to provide a dual input integrated unit having multiple operating rods 198, 198A, such as illustrated in FIG. 21. An additional pick-up assembly 202 is mounted 180 degrees (opposite end of housing 199) on the circumference of hollow toroid 55. This embodiment might be of particular use in a double robotic joint. Further this embodiment may be utilized as a dual input to a video game, or construction machine, where two hands are used simultaneously. In such an application the cylindrical housing 199 would be mounted horizontally, and suitable handles, attached to the operating rods 198, 198A. Although not shown additional pick-up assemblies (more than two) 202 may be mounted at 90 degree angles, or any other angle relative to the central axis of the hollow toroid core 55 as desired so long as the pick-up coil is mounted coplaner to the rotating flux lines. A plurality of pick-up assemblies greater than two may also be driven by one hollow toroid core, as the application may require.

Figure 7A:
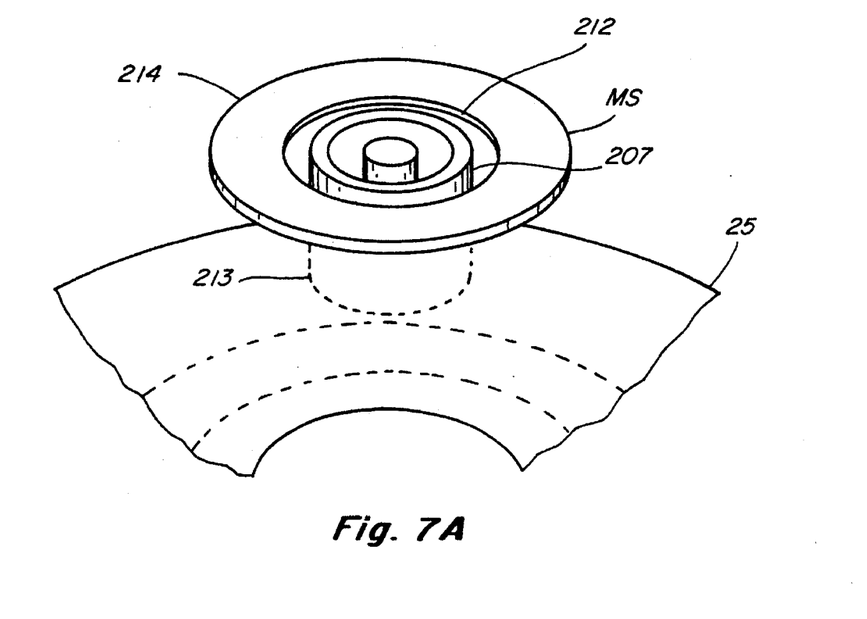
Figure 24:
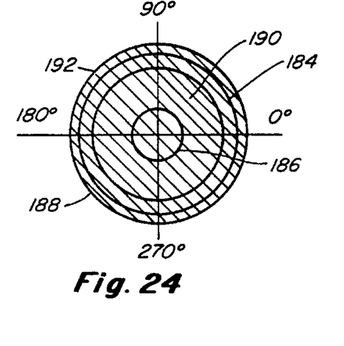
FIGS. 24–29 illustrate the flux coupling action of the segmented sphere upon the concave sensing face of pick-up core 188.
Figure 25:
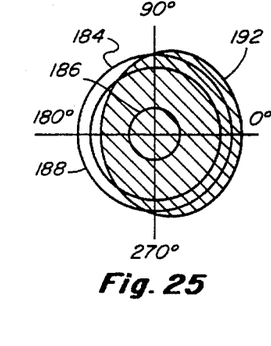
Figure 26:
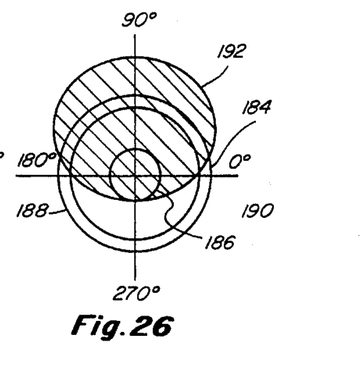
Figure 27:
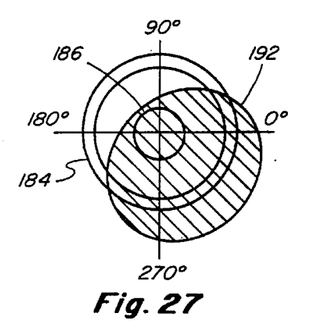
Figure 28:
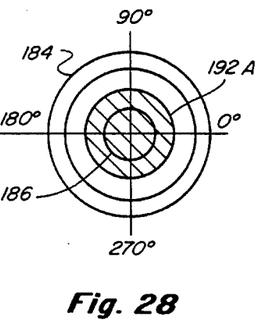
Figure 29:
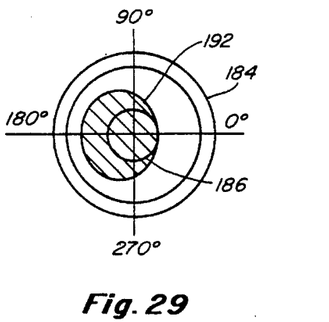
Figure 30:
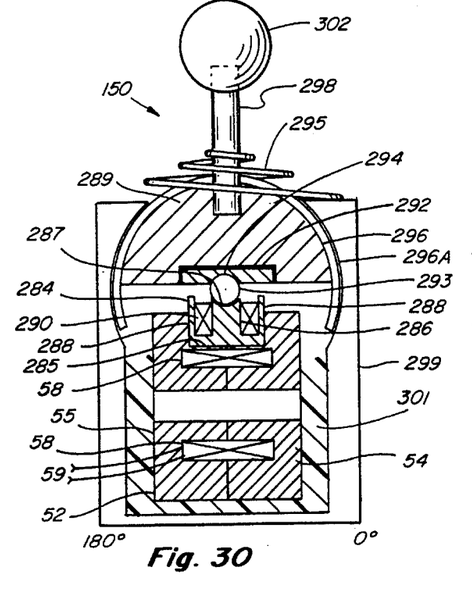
FIGS. 30–32 show a third embodiment of a polar coordinates joystick transducer utilizing a skewable disk and a ball and socket arrangement to direct the azimuth flux above the pick-up core.
Figure 31:
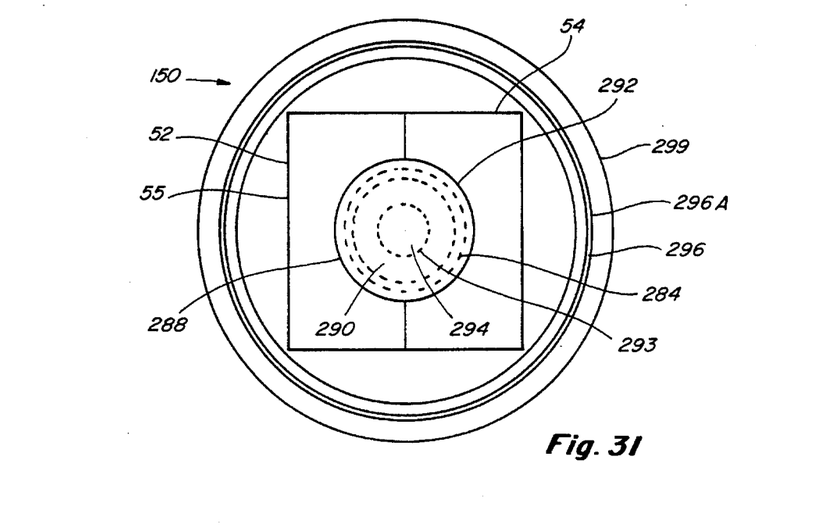
Figure 32:
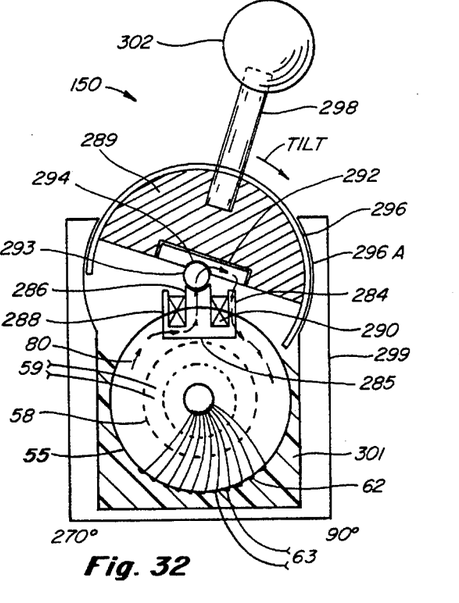

FIG. 23 is a top radial view of housing 199 with the hollow toroid driving core inside, notice pick-up core 188 is concentric to housing 199. FIGS. 24–29 are top views of pick-up core 188, illustrating the flux directing action of segmented sphere 192. FIG. 24 shows segmented sphere 192 exactly centered above pick-up core 188. In this centered position a 360 degree flux balance exists above pick-up core 188, and thus a signal null. In FIG. 25, when the operating rod is tilted toward the 180 degree azimuth the ferrous segmented sphere 192 moves off center as shown toward the 0 degree azimuth of pick-up core 188, coupling a measure of flux to pick-up coil 190. The amount of this coupling is determined by the operating rod tilt magnitude, and thus a 0 degree output signal is generated. FIG. 26 illustrates a greater operating rod tilt angle, because segmented sphere 192 is farther from the center than in FIG. 25, here the flux imbalance favors the 90 degree azimuth, and thus a high amplitude 90 degree signal is generated. To further illustrate the omni-directional capability of this joystick transducer, FIG. 27 shows the segmented sphere 192 offset a large amount toward the 315 degree azimuth and thus a high amplitude 315 degree signal is generated. The point to be made here, the omni-directional response of this unique transduction is as precise as the circular geometry of the pick-up core's spherical sensing face, which may be built to a very high precision. To further illustrate the simple 360 degree flux balance, a smaller segmented sphere 186 is shown in FIG. 28 exactly centered above pick-up core 188 in a signal null condition. FIG. 29 shows the same small segmented sphere 186 offset toward the 180 degree azimuth thus a 180 degree signal is generated. FIGS. 30, 31, 32 show a third embodiment of the present invention i.e. polar coordinates joystick transducer 150. The pick-up assembly of this embodiment comprises the following components, a skewable flux coupling disk 292 formed of ferromagnetic material, a flux ball 293, a ferromagnetic pick-up core 288, and a pick-up coil 290. The flux coupling disk 292 has a concave axis portion 294 which conforms to the spherical shape of flux ball 293 to provide a good flux path. Flux coupling disk 292 is skewable in a full 360 degree azimuth range upon flux ball 293, which in turn has a universal pivot above pick-up core 288, providing an azimuth-wise coupling mode of transduction. In FIG. 30 flux coupling disk 292 is shown in the centered position presenting a 360 degree symmetrical azimuth balanced flux pattern above the pick-up core outer magnetic pole 284, thus the pick-up coil sees a coplaner flux and a signal null is generated. The flux coupling action of disk 292 is further illustrated in FIG. 32, which is a central axis view of hollow toroid core 55 showing inside sine-cosine winding 58, with connecting leads 59. The outside sine-cosine excitation winding 62, having connecting leads 63, is wound in symmetry to the mounted pick-up core 288 for a signal null at the centered position. In FIG. 32 flux coupling disk 292 is skewed (tilted) toward the 90 degree azimuth of pick-up core 288. The flux arrows 80 illustrate the rotating magnetic field within hollow toroid 55 being conducted up through the base portion 285 of pick-up core 288, through the central magnetic pole 286, then through the ferromagnetic joint ball (flux ball) 293, from there through flux coupling disk 292, down through the 90 degree azimuth of outer magnetic pole 284 of pickup core 288, and back to hollow toroid core 55. The tilt direction shown in FIG. 32 generates an output signal having a 90 degree phase angle, with an amplitude corresponding to the magnitude of tilt (the greater the tilt the greater the amplitude), i.e. a polar coodinates signal. It is to be understood this flux coupling route is the same for all tilt directions, only the azimuth directions and output phase angle are different. Flux coupling disk 292 is attached to a non-magnetic hemispherical member 289, this member may be formed of a rigid plastic, and is encased by ball joint 296. Ball joint 296 is a hollow partial sphere formed of metal and is rotably mounted in a metal socket 296A, which in turn forms a portion of housing 299. The driving core 55 may be rigidly mounted in housing 299 by means of a rigid encapsulating compound 301. FIG. 31 is a top view of polar coordinates transducer 150 showing hollow toroid core 55 comprising core halves 52, 54, also shown is pick-up core 288, and these assemblies are contained in housing 299. The outside sine-cosine excitation winding is not shown in FIG. 30 for clarity. Alternately flux coupling disk 292 may be formed of a non-ferrous material such as copper or aluminum, in which case the flux would be coupled (unbalanced) to pick-up coil 180 degrees different in phase compared to ferromagnetic material. To further improve the linearity of the tilt amplitude response of the three polar coordinates joystick transducer embodiments of this disclosure, the non-ferrous washer-like magnetic shield that was disclosed in my previous patent applications may be mounted concentrically around the extending portion of the mounted pickup cores, as is illustrated in FIG. 7A. In FIG. 7A pick-up core 207 is mounted partially within a bore 213 in the wall of hollow toroid driving core 25. Non-ferrous magnetic shield MS has an outer diameter 214 and an inner diameter 212. The purpose of magnetic shield MS is to act as a high reluctance eddy current reflector to any background flux leakage from the hollow toroid core 55, and thus the rotating magnetic field within the hollow toroid core is coupled to the joystick transduction elements soley by the pick-up core.

Figure 33:
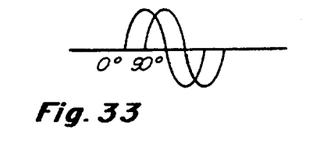
FIG. 33 is a sine-cosine graph of the preferred excitation used to drive the hollow toroid core of this invention.
Figure 34:
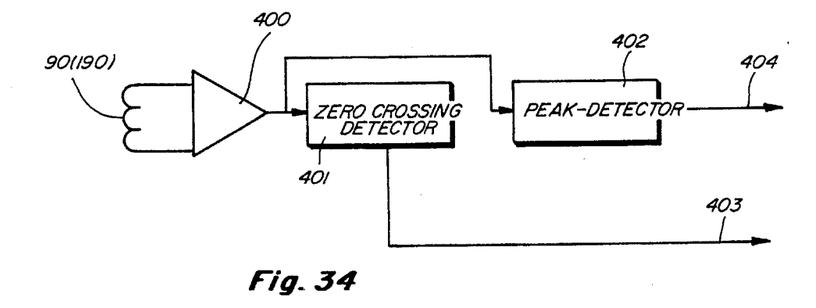
FIG. 34 is a block diagram of a phase-amplitude detection circuit that may be used to interface the output signal generated by this invention to the host computer.

FIG. 33 is a graphical illustration of the sine-cosine excitation applied to the insine and outside excitation windings, which consist of two pure sinewaves displaced by 90 degrees. FIG. 34 is an interface circuit that may be used between the present invention and the host computer. This block diagram shows the polar coordinates joystick transducer pick-up coil 90(190) connected to a differential pre-amplifier 400. From pre-amplifier 400 the amplified signal is fed to zero crossing detector 401 to extract the tilt direction phase angle which is fed over lead 403 to the host computer. Pre-amplifier 400 also feeds peak detector 402 to extract the amplitude corresponding to the magnitude of joystick tilt, from here the amplitude component is fed over lead 404 to the host computer.

I claim:

1. A joystick generating a polar coordinates signal in which the signal phase angle represents the joystick tilt direction, and the signal amplitude represents the magnitude of tilt, said joystick comprising:

a) a toroidal shaped azimuth flux directing means concentrically attached to one end of an operator rod, the said operator rod being pivotably mounted in a housing;

b) a polar sensor having an annular sensing face driven by a rotating magnetic field within a hollow toroid driving core for generating said polar coordinates signal;

i) the said driving core comprising:

ii) a hollow toroid core formed of a ferromagnetic material having an octagonal outer circumference;

iii) a bore disposed in the center of a flat portion of the octagonal shaped outer circumference, the axis of said bore being perpendicular to the central axis of the hollow toroid core;

iv) the polar sensor being mounted partially within the said bore, with an extending portion outside the hollow toroid wall;

v) a first excitation winding wound within the hollow toroid core for inducing a first magnetic field throughout the hollow toroid core;

vi) a second excitation winding wound around the outside of the hollow toroid core, comprising four sub-coils at equally spaced positions, being wound in symmetry to the mounted polar sensor, for flux balance, said second excitation winding for inducing a second magnetic field throughout the hollow toroid core;

vii) sine-cosine excitation being applied to the first and second excitation windings for inducing a rotating magnetic field throughout the hollow toroid core, said field having distributive axes perpendicular to a line drawn tangent to the surface of the hollow toroid core at all points;

viii) the hollow toroid core being separable for assembly;

ix) the hollow toroid driving core being rigidly mounted in the housing with the mounted polar sensor disposed concentrically adjacent the toroidal shaped azimuth flux directing means.

2. The joystick according to claim 1, wherein the said polar sensor comprises:

a) a pick-up core formed of ferromagnetic material, further comprising:

i) a central cylindrical pole, concentrically surrounded by a cylindrical outer pole, providing an annular pick-up coil space, and a base portion for connecting these two poles at one end, the opposite end forming the said annular sensing face, for generating a balanced rotating sensing pattern;

ii) Faraday shielding attached to the backside of the base portion, and being grounded;

iii) a pick-up coil wound around the central cylindrical pole for generating the said polar coordinates signal;

iv) the said pick-up coil being disposed coplanar to the rotating magnetic field for a signal null when the joystick is in the centered position;

v) a flat non-ferrous washer-like magnetic shield disposed concentrically around the extending portion of the mounted polar sensor for blocking flux leakage from the hollow toroid driving core.

3. The joystick according to claim 1, wherein the said toroidal shaped azimuth flux directing means comprises:

i) a toroidal shaped flux concentrating ring formed of ferromagnetic material having a central axis, the said flux concentrating ring being coaxially attached to the lower end of said operating rod by means of a non-metallic washer;

ii) the said toroidal shaped flux concentrating ring being disposed concentric to the said annular sensing face for a signal null with the operator rod in the centered position, tilting of the operator rod moves the flux concentrating ring eccentric to the annular sensing face coupling flux to the pick-up coil generating said polar coordinates signal;

a) the operating rod being pivotably supported in the said housing by a ball and socket means;

b) a self-centering means for urging the operator rod to the center position comprising:

c) a tubular sliding detent member having a collar at one end, said detent member being disposed over the operator rod between the non-metallic washer and a raised socket flange formed on the said socket means;

c) a compression spring over the tubular sliding detent member, said spring acting against the collar and the non-metallic washer to urge the operator rod to the centered position, the collar and raised socket flange providing a break-out action.

4. The joystick according to claim 3, wherein the self-centering means further comprises:

i) a tublar sliding detent member disposed over the said operating rod said detent member further comprising: an increased diameter portion at the upper end forming a collar;

ii) a raised circular flange formed around the bottom portion of said socket;

iii) a compression spring concenrically disposed around the sliding detent member for providing a force between the said attachment washer and the said collar to urge said collar to a flat contact with said raised circular flange at the centered position;

iv) the diameter of said collar being being greater than the diameter of the said raised circular flange to provide the said break-out action.

5. The joystick according to claim 3, further defined as a thumb actuated joystick, further comprising:

a) a saddle shaped thumb botton attached to the top end of the said operating rod, and also having a counterweight inside, also having an anti-rotation means for limiting the rotation range of the thumb actuated button by means of a pin mounted partially within a bore in the said ball socket and pin engaging a groove in said ball.

6. The joystick according to claim 3, wherein the said toroidal shaped flux concentrating ring is formed of a non-ferrous metal, for generating a polar coordinates signal approximately 180 degrees out of phase compared to the said ferromagnetic flux concentrating ring.

7. The joystick according to claim 1, further defined as a multiple joystick device utilizing the distributive axes of the rotating magnetic within the hollow toroid driving core, wherein:

a) a plurality of individual polar sensors are mounted in a respective plurality of bores disposed in the hollow toroid driving core at a plurality of outer circumference locations, each having individual toroidal shaped flux concentrating rings and respective operating means, for generating a plurality of polar coordinates signals simultaneously.

8. A joystick generating a polar coordinates signal in which the signal phase angle represents the joystick tilt direction and the signal amplitude represents the magnitude of joystick tilt, said joystick comprising:

i) an operating rod for rotating a flux coupling means; the said flux coupling means comprising:

ii) a segmented sphere formed of ferromagnetic material mounted in the lower hemisphere of a non-metallic sphere, the said segmented sphere being being coaxial with with the lower hemisphere;

iii) the said non-metallic sphere being rotatably supported in a spherical socket; the said socket being mounted in a housing means;

a) a polar sensor driven by a rotating magnetic within a hollow toroid driving core for generating said polar coordinates signal;

b) the said driving core comprising:
   a hollow toroid core formed of ferromagnetic material having a bore disposed in the outer circumference wall, the axis of the said bore being perpendicular to the central axis of the hollow toroid core;
c) the said polar sensor being mounted partially within the said bore leaving an extending portion outside the driving core wall;
d) a first excitation winding wound within the hollow toroid core, for inducing a first magnetic field throughout the hollow toroid;
e) a second excitation winding wound around the outside of the hollow toroid core for inducing a second magnetic field throughout the hollow toroid core, said second excitation winding being sub-divided and wound in symmetry to the mounted polar sensor for flux symmetry;
f) sine-cosine excitation being applied to the first and second excitation windings for inducing a rotating magnetic field throughout the hollow toroid core, said rotating magnetic field having distributive axes prependicular to the core surface at all points;
g) the said driving core being separable for assembly;
h) the hollow toroid driving core being rigidly mounted in the said housing with the mounted polar sensor disposed concentrically adjacent the said flux coupling means.

9. The joystick according to claim 8, wherein the said polar sensor comprises;

a) a pick-up core formed of ferromagnetic material, further comprising:
   i) a central cylindrical , concentrically surrounded by a cylindrical outer pole and spaced apart to provide an annular pick-up coil space, and a base portion for connecting these two poles at one end, the opposite end being an annular sensing face, the said annular sensing face further comprising a concave shape to conform to the spherical shape of the segmented sphere flux coupling means for greater flux coupling to the pick-up coil;
   ii) a pick-up coil wound around the central cylindrical pole for generating the said polar coordinates signal; the said pick-up coil being coplanar to the driving flux for a signal null when the said operating rod is in the centered position;
   iii) a flat non-ferrous washer-like magnetic shield disposed concentrically around the said extending portion of of the mounted polar sensor as a high reluctance to block flux leakage from the surface of the driving core.

10. The joystick according to claim 9, wherein the driven polar sensor is rigidly mounted in the said housing by means of a nonmetallic potting compound with the concave shaped sensing face adjacent the non-metallic sphere for flux coupling to the said segmented sphere and generating a polar coordinates signal.

* * * * *